US008994464B2

(12) United States Patent
Chen et al.

(10) Patent No.: US 8,994,464 B2
(45) Date of Patent: Mar. 31, 2015

(54) SYSTEMS AND METHODS FOR A HIGH GAIN BANDWIDTH, LOW POWER TRANS-IMPEDANCE VOLTAGE GAIN AMPLIFIER (TIVA) TOPOLOGY

(71) Applicant: Taiwan Semiconductor Manufacturing Co. Ltd., Hsin-Chu (TW)

(72) Inventors: Tung-Tsun Chen, Hsinchu (TW); Jui-Cheng Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 67 days.

(21) Appl. No.: 13/647,468

(22) Filed: Oct. 9, 2012

(65) Prior Publication Data

US 2014/0097902 A1    Apr. 10, 2014

(51) Int. Cl.
  *H03B 5/30* (2006.01)
  *H03G 3/30* (2006.01)
(52) U.S. Cl.
  CPC ............... *H03G 3/3036* (2013.01); *H03B 5/30* (2013.01); *H03F 2200/36* (2013.01)
  USPC .......................... 331/116 M; 331/154; 330/98
(58) Field of Classification Search
  CPC ............. H03B 5/30; H03B 5/32; H03B 5/36; H03B 2200/0058
  USPC ..................................... 331/116 M, 154, 156
  See application file for complete search history.

(56) References Cited

U.S. PATENT DOCUMENTS

| 4,801,893 | A | 1/1989 | Perandi |
| 5,017,884 | A | 5/1991 | Perandi |
| 6,236,281 | B1 * | 5/2001 | Nguyen et al. ............... 331/154 |
| 7,453,322 | B2 | 11/2008 | Li et al. |
| 8,378,756 | B2 * | 2/2013 | Huang et al. ................. 331/154 |
| 8,504,164 | B2 * | 8/2013 | Karr ................................ 607/60 |
| 2007/0257740 | A1 * | 11/2007 | Boser et al. .................. 331/154 |

OTHER PUBLICATIONS

Lavasani, Hossein Miri, Reza Abdolvand, and Farrokh Ayazi. "A 500MHz Low Phase-Noise A1N-on-Silicon Reference Oscillator." Custom Integrated Circuits Conference, 2007. CICC'07. IEEE. IEEE, 2007. pp. 599-602.*
Miri Lavasani, Hossein, et al. "A 76 dBΩ 1.7 GHz 0.18 μm CMOS Tunable TIA Using Broadband Current Pre-Amplifier for High Frequency Lateral MEMS Oscillators." IEEE journal of solid-state circuits 46.1 (Jan. 2011): 224-235.*
Young, Darrin J., I. Engin Pehlivanoğlu, and Christian A. Zorman. "Silicon carbide MEMS-resonator-based oscillator." Journal of Micromechanics and Microengineering 19.11 (2009): 115027.*

(Continued)

*Primary Examiner* — Ryan Johnson
(74) *Attorney, Agent, or Firm* — Eschweiler & Associates, LLC (57) ABSTRACT

An amplifier and oscillator system includes a MEMS resonator and a two stage amplifier topology. The MEMS resonator is configured to generate a resonator signal. The two-stage amplifier topology is configured to amplify the resonator signal with a selected trans-impedance gain. Additionally, the two stage amplifier topology yields a feedback resistance that provides the selected trans-impedance gain.

18 Claims, 8 Drawing Sheets

(56) References Cited

OTHER PUBLICATIONS

Pardo et al., "A Phase-Noise Model for Nonlinear Piezoelectrically-Actuated MEMS oscillators", Circuits and Systems (ISCAS), 2011 IEEE International Symposium on. IEEE, May 5-18, 2011, pp. 221-224.*

Yu-Wei Lin, et al.; "Series-Resonant VHF Micromechanical Resonator Reference Oscillators"; IEEE Journal of Solid-State Circuits, vol. 39, No. 12, Dec. 2004, p. 2477-2491.

* cited by examiner

SYSTEMS AND METHODS FOR A HIGH GAIN BANDWIDTH, LOW POWER TRANS-IMPEDANCE VOLTAGE GAIN AMPLIFIER (TIVA) TOPOLOGY

BACKGROUND

Microelectromechanical system (MEMS) resonators or oscillators are small electromechanical structures that vibrate at high frequencies. They are used for timing references, signal filtering, mass sensing, biological sensing, motion sensing, and other diverse applications.

For frequency and timing references, MEMS resonators are generally attached to electronic circuits, often called sustaining amplifiers, to drive them in continuous motion. These circuits are typically located near the resonators and in the same physical package. In addition to driving the resonators, these circuits produce output signals for downstream electronics.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

A microelectromechanical (MEMS) oscillator utilizes a trans-impedance voltage gain amplifier (TIVA) to operate. An important feature of the amplifier used in such systems is its trans-impedance gain and bandwidth. This disclosure includes systems and methods that employ a two-stage topology TIVA to enhance gain and bandwidth with a relatively small resistor area and low power consumption.

Crystal based resonators have been used for generation timing signals. Crystal resonators are relatively large and consume large amounts of power. In contrast, MEMS oscillators are relatively smaller and consume less power. However, MEMS based oscillators require amplification by a trans-impedance voltage gain amplifier that utilizes a relatively large impedance or resistance value to properly amplify the signal generated by the MEMS resonator.

Figure 1:
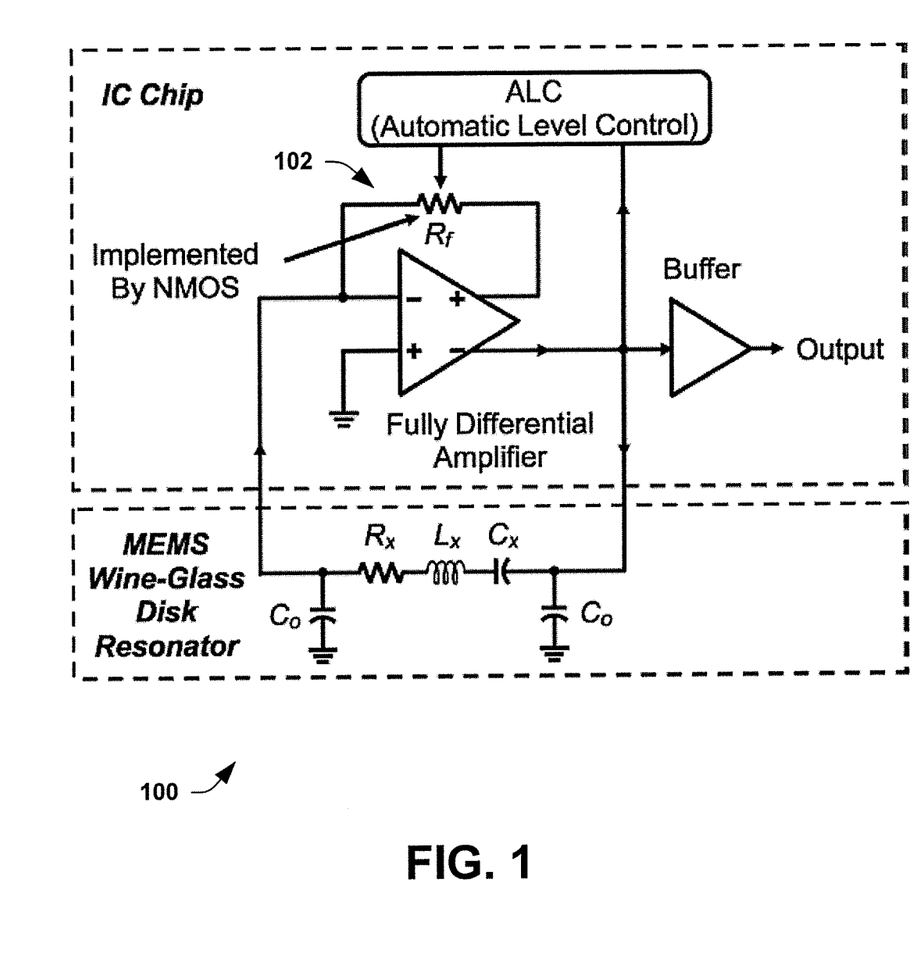
FIG. 1 is a diagram of a MEMS system using a large feedback resistance and resistance level control.

FIG. 1 is a diagram of a MEMS system 100 using a large feedback resistance and resistance level control. The system includes a MEMS resonator, an output buffer, a differential amplifier, and an automatic level control. The amplifier includes a relatively large resistance $R_f$ 102 for feedback.

An output of the MEMS resonator and a feedback signal from $R_f$ 102 is provided as an input to the differential amplifier. An output of the amplifier is provided to the buffer, which provides a system output.

Sub-threshold operating transistors provide a large resistance ($R_f$) to amplify the small current generated by the MEMS resonator. A dominant pole is $$\sim \frac{1}{R_f C_0}$$

and a non-dominant pole is $$\sim \frac{g_{ds4}}{C_0}.$$

Both poles are low at a relatively low frequency because $R_f$ needs to be larger than $R_x$ to keep oscillating, and $g_{ds4}$ is small enough to maintain a suitable open loop gain of fully differential amplifier. A relatively large transistor flicker noise is introduced by the sub-threshold operating transistors, which degrades the phase noise performance of oscillator.

Figure 2:
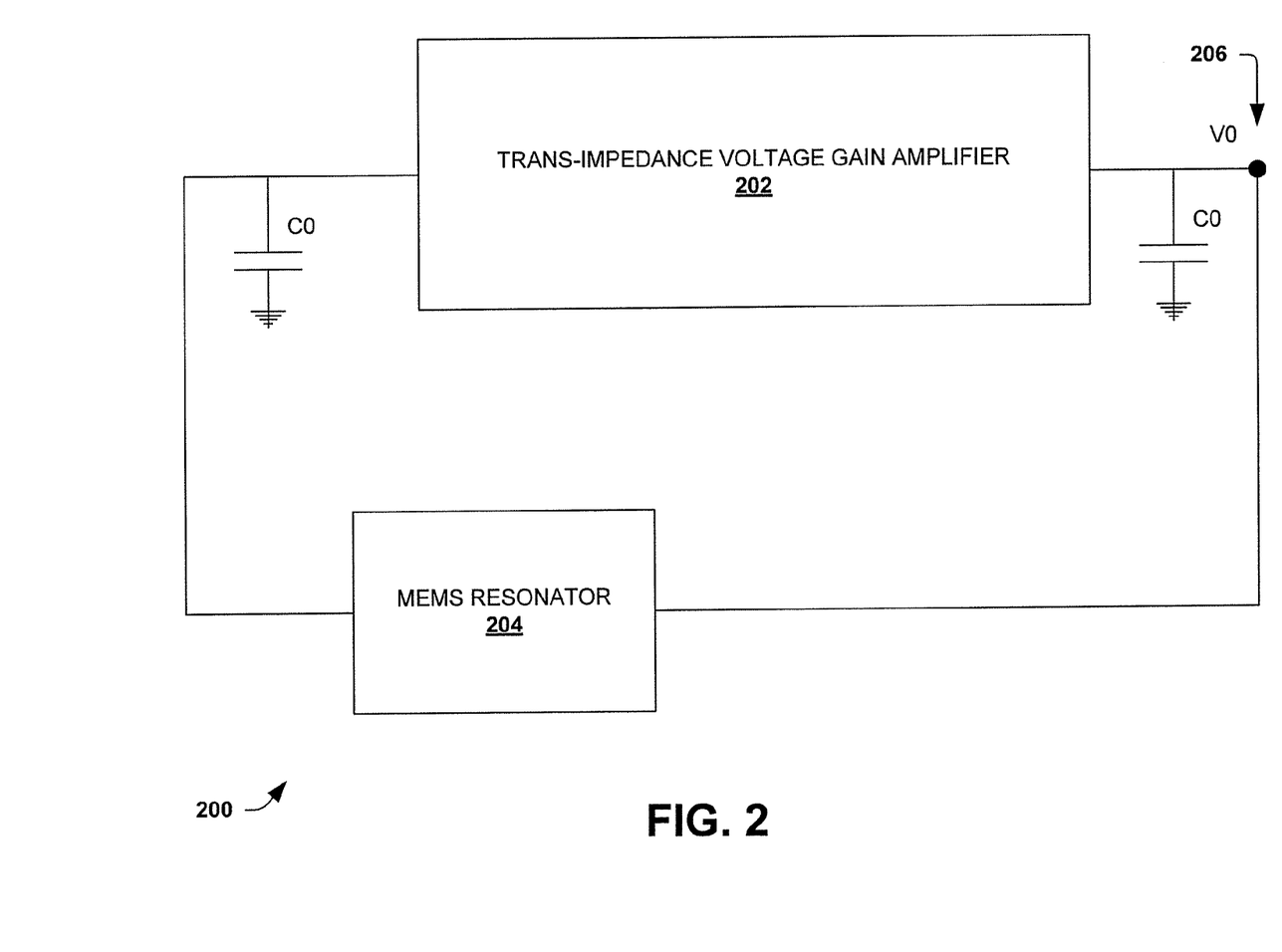
FIG. 2 is a block diagram illustrating a trans-impedance voltage gain amplifier and MEMS oscillator system.

FIG. 2 is a block diagram illustrating a trans-impedance voltage amplifier (TIVA) and MEMS oscillator system 200. The system 200 provides a high gain bandwidth and low power topology.

The system 200 includes a trans-impedance voltage amplifier (TIVA) topology 202 and a MEMS resonator 204. The system 200 provides an output signal at an output terminal 206, which is proximate to an output side of the topology 202. Additionally, capacitors C0 are present and input and output sides of the amplifier topology 202 as shown.

The system 200 provides the output signal as an amplified version of a resonator signal generated by the MEMS resonator 204. The resonator signal is typically relatively small. The output signal is substantially amplified from the resonator signal. The amplifier topology 202 performs the amplification with a high gain factor and low power consumption. Further, the topology 202 consumes less chip space and power as compared to other techniques, such as that shown in FIGS. 1A and 1B.

Figure 3:
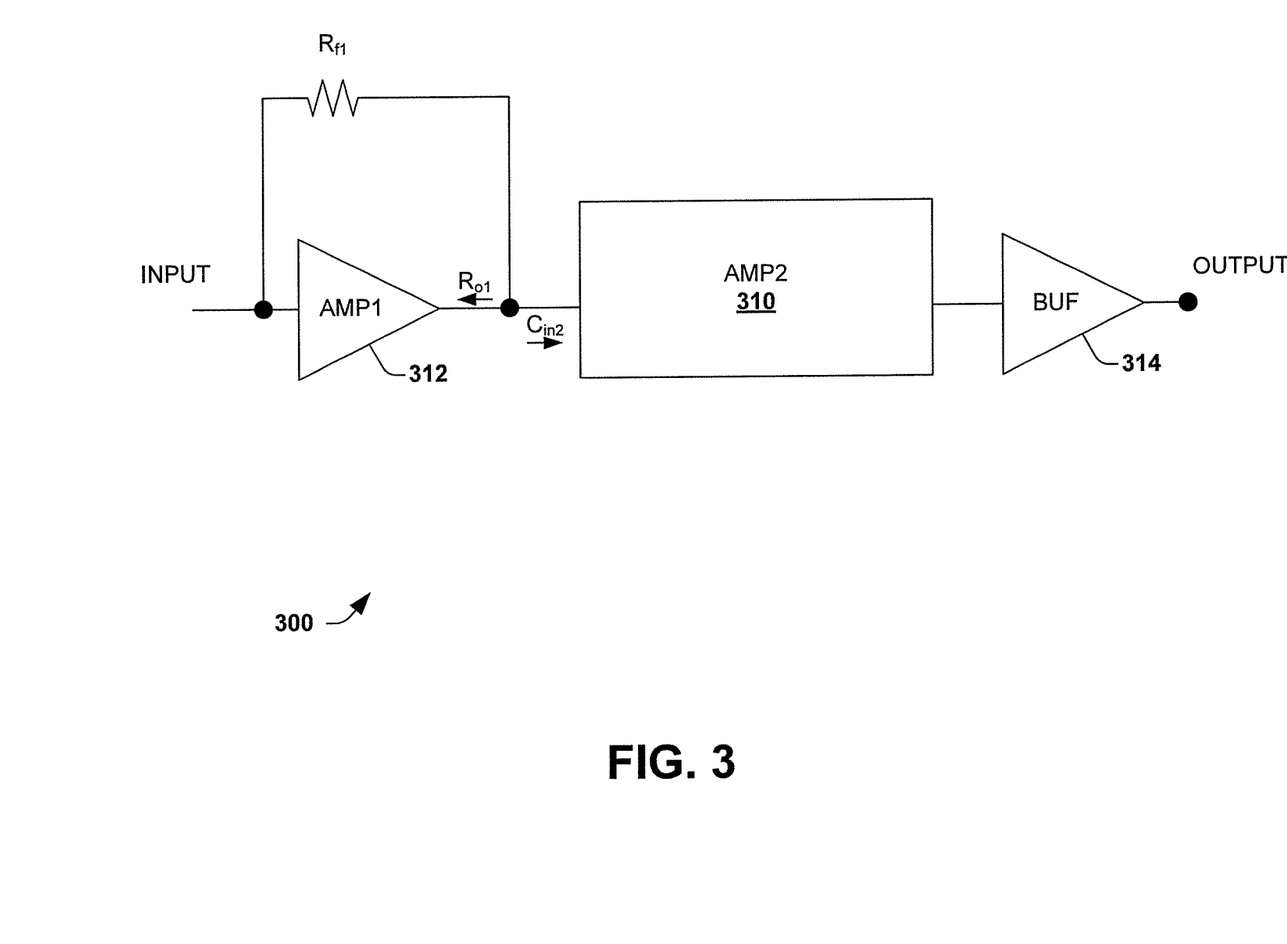
FIG. 3 is a diagram illustrating a trans-impedance amplifier voltage gain amplifier topology that utilizes a two-stage topology and a smaller chip area to provide feedback resistance.

FIG. 3 is a diagram illustrating a trans-impedance voltage amplifier (TIVA) topology 300 that utilizes a two-stage topology and a smaller chip area to provide feedback resistance. The topology suppresses flicker noise and provides poles for feedback resistance at relatively higher frequencies than other approaches. The topology 300 can be utilized for the topology 202 of FIG. 2.

The topology 300 includes a first amplifier 312, a second amplifier stage 310, and a buffer 314. The first amplifier 312 receives an input signal and a first amplifier feedback signal at its input. Further, the first amplifier 312 provides a first amplifier output at its output. A first feedback resistor ($R_{f1}$) is coupled between the input and the output of the first amplifier 312 and provides the first amplifier feedback signal. The first amplifier 312 and the feedback resistor $R_{f1}$ collectively comprise a first amplifier stage.

The first amplifier stage provides or sustains a current to voltage (I to V) amplifications at a trans-impedance gain of the first stage. The first amplifier 312 provides an open-loop voltage gain to sustain the first amplifier feedback signal, also referred to as the trans-impedance feedback loop of the first stage.

A second amplifier stage 310 receives the first amplifier output at an input and provides a second amplifier output at its output. The second amplifier output is received by the buffer 314, which buffers the signal and provides an output signal at its output. The output signal of the buffer 314 is the output signal for the topology 300.

The second amplifier stage 310 provides voltage gain and amplifies the trans-impedance gain of the first stage further. The second stage can be configured in several ways. In one example, the second stage 310 is configured as an open-loop amplifier to provide an open loop voltage gain. In another example, the second stage 310 is configured as a closed loop amplifier using resistive and/or capacitive feedback elements to amplify the trans-impedance of the first stage further.

An output resistance of the first amplifier 312 is designated as $R_{O1}$. An input capacitance of the second amplifier stage 310 is designated as $C_{in2}$. As a result, a trans-impedance gain (defined by the feedback resistance $R_f$) is amplified by the second amplifier stage 310 and is $R_f = A_{v2} * R_{f1}$. $A_{v2}$ is an open loop gain of the second amplifier stage 310.

The open loop gain, in this example, has a value within a range of 10 to 100. This results in a resistor chip area of about 10 to 100 times smaller than other approaches, such as the approach discussed in FIGS. 1A and 1B. Further, with the same trans-impedance gain, an input pole is Av2 higher than other approaches. A non dominant pole is at a frequency of about $$\frac{1}{R_{o1}C_{in2}} \times C_{in2}.$$

Thus, the non-dominant pole can be one order smaller than $C_0$, which moves the pole to a higher frequency. With a similar bias current, a dominant pole and the non-dominant pole are both moved to a higher frequency, which mitigates power consumption.

Figure 4:
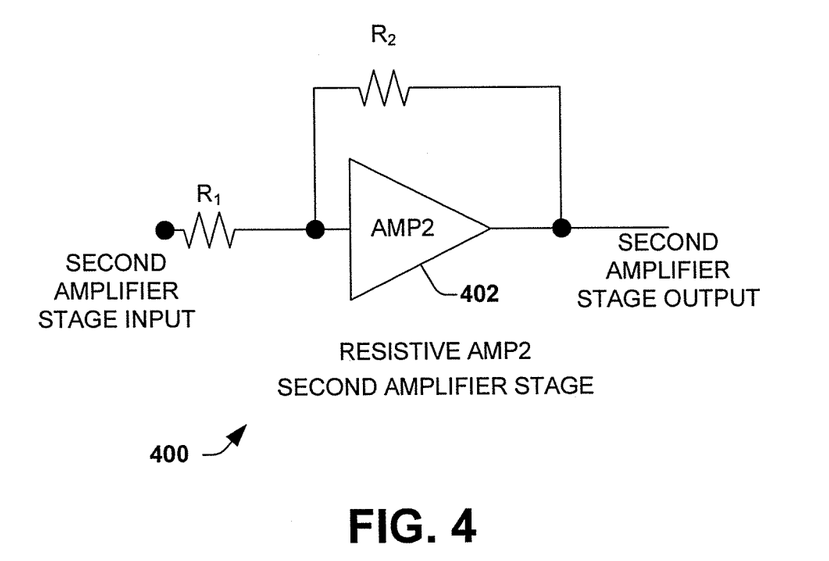
FIG. 4 is a diagram illustrating an amplifier stage utilizing resistive components to generate a selected trans-impedance gain.

FIG. 4 is a diagram illustrating an amplifier stage 400 utilizing resistive components to generate a selected trans-impedance gain. The amplifier stage 400 can be utilized as the second amplifier stage 310 in FIG. 3.

The amplifier stage 400 receives a second amplifier stage input and provides a second amplifier output. The amplifier stage includes a second amplifier 402, a first resistor $R_1$, and a second resistor $R_2$. The second amplifier 402 has an input that receives a second feedback signal via the second resistor $R_2$ and also receives the second amplifier stage input via the first resistor $R_1$. The second amplifier 402 provides the second amplifier stage output at its output. The second amplifier stage output is also provided to the second resistor $R_2$, which in turn generates the second feedback signal.

The feedback resistance $R_f$ is thus based solely on resistive elements. The feedback resistance $R_f$ for a two stage topology as described above is given by:

$$R_f = R_{f1} \times R_2/R_1$$

Figure 5:
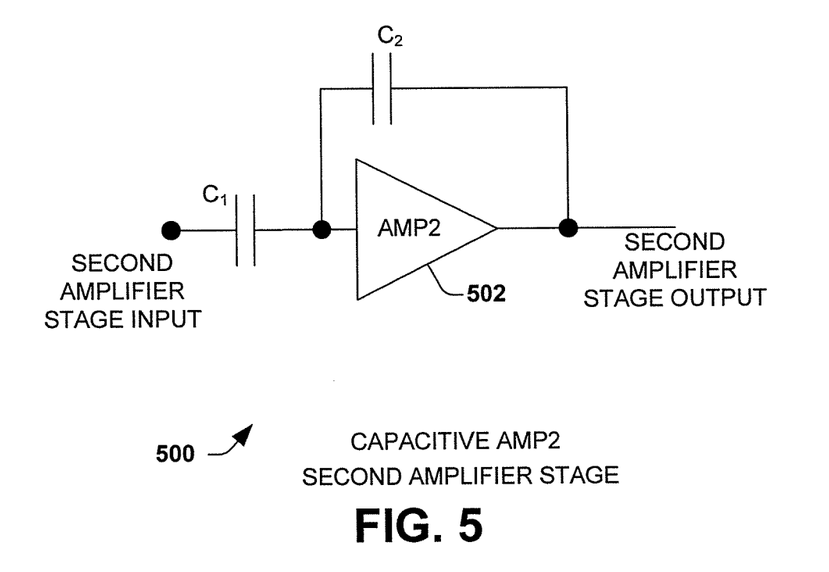
FIG. 5 is a diagram illustrating an amplifier stage utilizing capacitive components to generate a selected trans-impedance gain.

FIG. 5 is a diagram illustrating an amplifier stage 500 utilizing capacitive components to generate a selected trans-impedance gain. The amplifier stage 500 can be utilized as the second amplifier stage 310 in FIG. 3.

The amplifier stage 500 receives a second amplifier stage input and provides a second amplifier output. The amplifier stage includes a second amplifier 502, a first capacitor $C_1$, and a second capacitor $C_2$. The second amplifier 502 has an input that receives a second feedback signal via the second capacitor $C_2$ and also receives the second amplifier stage input via the first capacitor $C_1$. The second amplifier 502 provides the second amplifier stage output at its output. The second amplifier stage output is also provided to the second capacitor $C_2$, which in turn generates the second feedback signal.

The feedback resistance $R_f$ is thus based at least partially on capacitive elements. The feedback resistance $R_f$ for a two stage topology as described above is given by:

$$R_f = R_{f1} \times C_1/C_2$$

Figure 6:
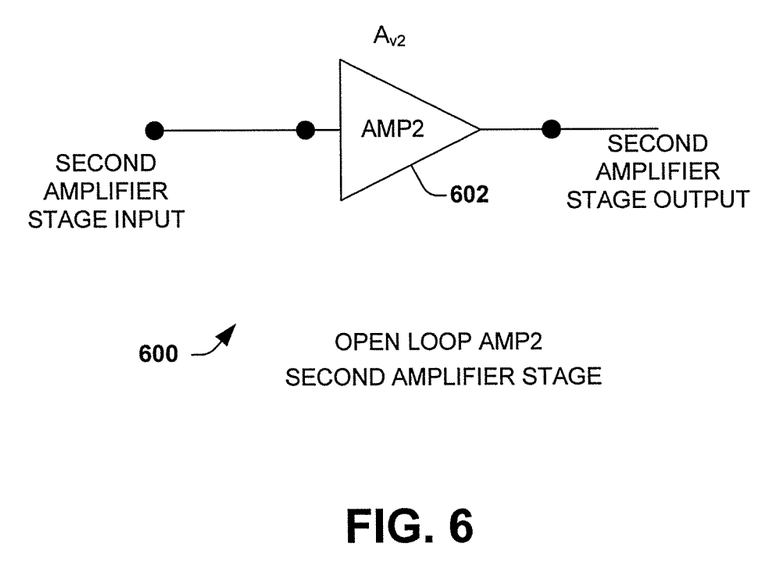
FIG. 6 is a diagram illustrating an amplifier stage utilizing an open loop configuration to generate a selected trans-impedance gain.

FIG. 6 is a diagram illustrating an amplifier stage 600 utilizing an open loop configuration to generate a selected trans-impedance gain. The amplifier stage 600 can be utilized as the second amplifier stage 310 in FIG. 3.

The amplifier stage 600 receives a second amplifier stage input and provides a second amplifier output. The amplifier stage includes a second amplifier 602 having an open loop gain of $A_{v2}$. The second amplifier 602 has an input does not receive a feedback signal in this example. The second amplifier 602 only receives the second amplifier stage input at its input. The second amplifier 602 provides the second amplifier stage output at its output.

The feedback resistance $R_f$ is thus based partially on the open loop gain $A_{v2}$ of the second amplifier 602. The feedback resistance $R_f$ for a two stage topology as described above is given by:

$$R_f = R_{f1} \times A_{v2}$$

Figure 7:
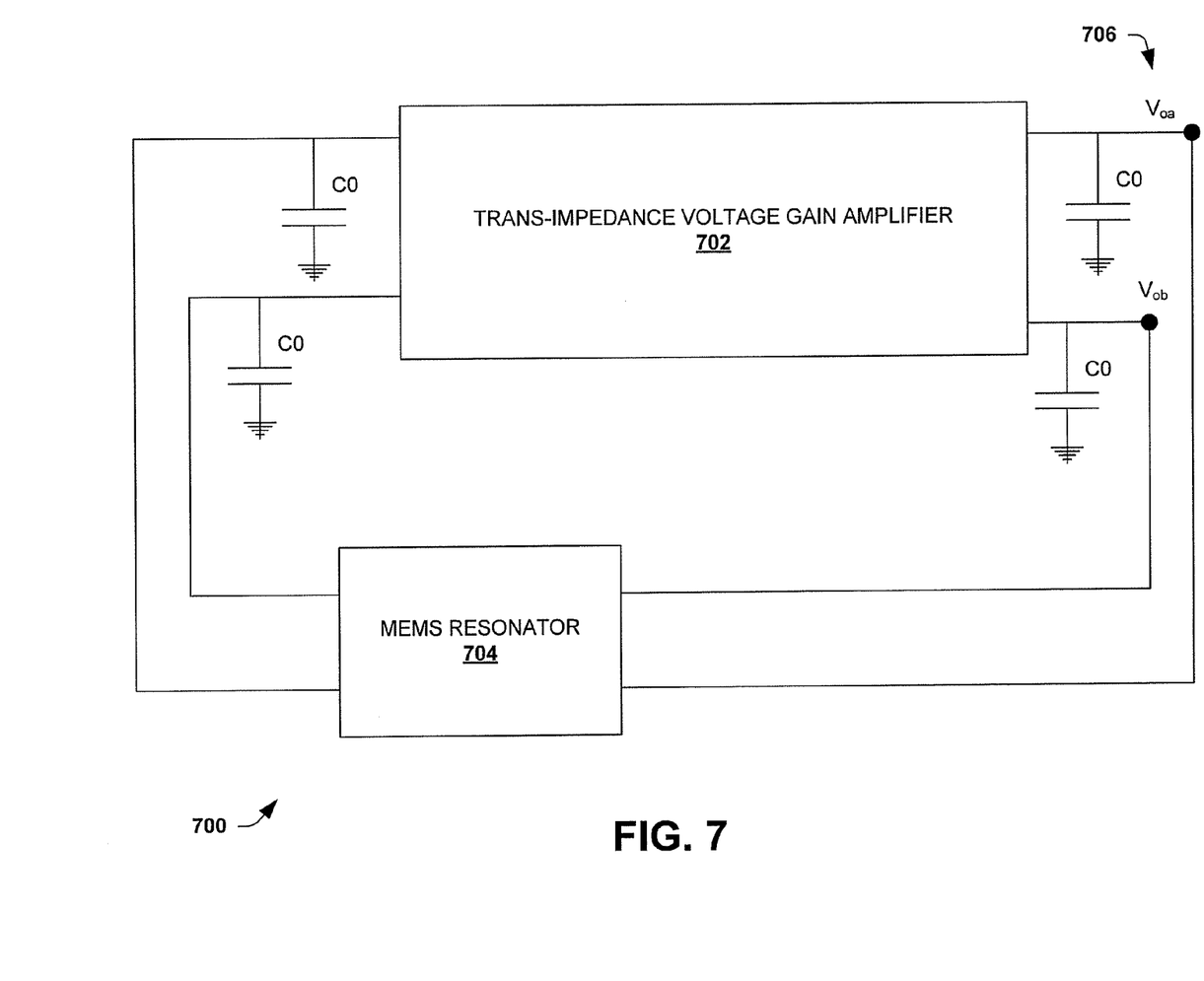
FIG. 7 is a block diagram illustrating a differential type two stage trans-impedance voltage gain amplifier and MEMS oscillator system.

FIG. 7 is a block diagram illustrating a differential type two stage trans-impedance voltage gain amplifier and MEMS oscillator system 700. The system 700 provides a high gain bandwidth and low power topology. The differential system 700 can provide better noise rejection than similar non-differential systems.

The system 700 includes a trans-impedance voltage gain amplifier topology 702 and a MEMS resonator 704. The system 700 provides a differential output signal at output terminals 706, which is proximate to an output side of the topology 702. Additionally, capacitors C0 are present and input and output sides of the amplifier topology 702 as shown.

The system 700 provides the differential output signal as an amplified version of a differential resonator signal generated by the MEMS resonator 704. The resonator signal is typically relatively small. The differential output signal is substantially amplified from the resonator signal. The two stage amplifier topology 702 performs the amplification with a high gain factor and low power consumption. Further, the topology 702 consumes less chip space and power as compared to other techniques, such as that shown in FIGS. 1A and 1B.

Figure 8:
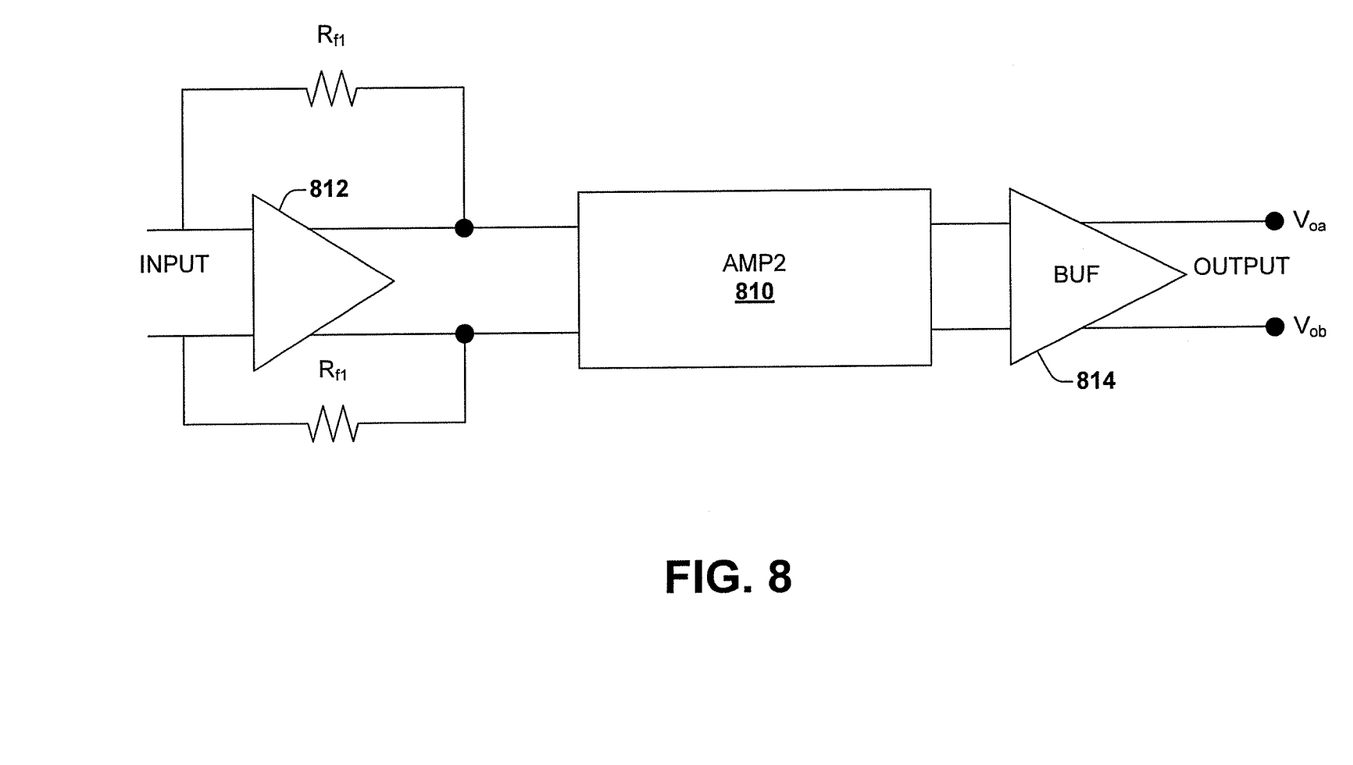
FIG. 8 is a diagram illustrating a differential trans-impedance voltage gain amplifier topology.

FIG. 8 is a diagram illustrating a differential trans-impedance voltage gain amplifier topology 800. The differential topology 800 suppresses flicker noise and provides poles for feedback resistance at relatively higher frequencies than other approaches. The topology utilizes a two-stage topology and a smaller chip area to provide feedback resistance. The topology 800 can be utilized for the topology 702 of FIG. 7.

The topology 800 includes a first differential amplifier 812, a second differential amplifier stage 810, and a differential buffer 814. The first amplifier 812 receives a differential input signal and a first amplifier feedback signal at its inputs. Additionally, the first amplifier 812 provides a differential first amplifier output at its outputs. First feedback resistors ($R_{f1}$) are coupled between the inputs and the outputs of the first amplifier 812 and provide the differential first amplifier feedback signal to the differential inputs. The first amplifier 812 and the feedback resistors $R_{f1}$ comprise a first differential amplifier stage. The feedback resistors can be formed on chip, such as poly silicon bases resistors.

The first differential amplifier stage sustains the current to voltage (I to V) amplification by a trans-impedance gain. The first differential amplifier 812 provides an open loop voltage gain to sustain the first feedback, also referred to as the trans-impedance feedback.

The second differential amplifier stage 810 receives the differential first amplifier output at its inputs and provides a second differential amplifier output at its output. The second amplifier output is received by the differential buffer 814, which buffers the signal and provides a differential output signal ($V_{oa}$ and $V_{ob}$) at its output. The output signal of the buffer 814 is the output signal for the topology 800.

The second stage 810 provides additional voltage gain and amplifies thet transs-impedance gain of the first stage. The second stage 810 can include an open-loop amplifier (but differential type) to provide an open loop voltage gain, such as shown in FIG. 6. Additionally, the second stage 810 can also include a closed loop resistive and/or capacitive based amplifier such as shown in FIGS. 4 and 5.

The feedback resistance $R_f$ can be adjusted or controlled using the above techniques described for non-differential types. Thus, the feedback resistance $R_f$ can be solely resistive, at least partially capacitive, and/or at least partially based on the open loop gain of a second stage of an amplifier.

Figure 9:
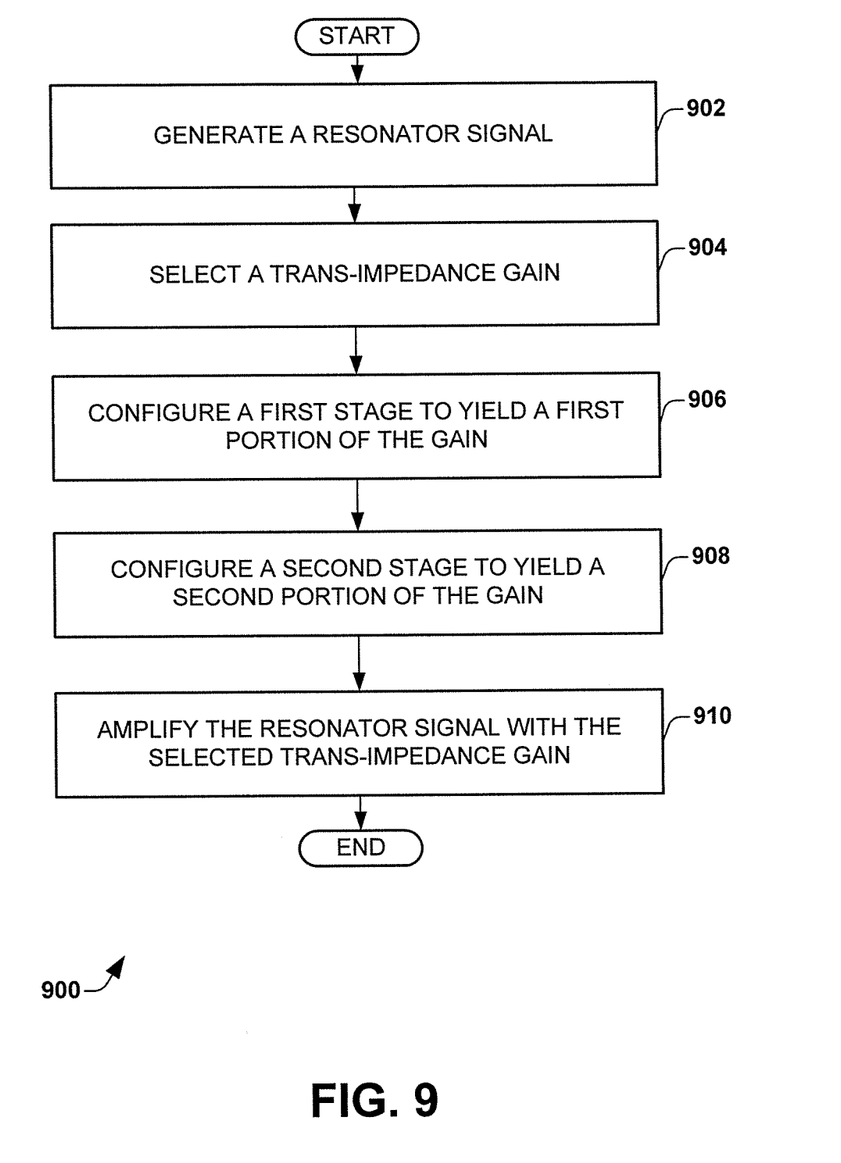
FIG. 9 is a flow diagram illustrating a method of operating and/or configuring a MEMS oscillator system.

FIG. 9 is a flow diagram illustrating a method 900 of operating and/or configuring a MEMS oscillator system. The method 900 utilizes a multi-stage trans impedance amplifier topology to amplify a signal from a resonator circuit. A trans-impedance gain is obtained without using a relatively large amount of chip space.

The method begins at block 902, wherein a resonator signal is generated. The resonator signal is generated by a MEMS resonator. The resonator signal is relatively small.

A trans-impedance gain for the resonator signal is selected at block 904. The trans-impedance gain is selected to yield a large enough system output signal. In one example, the trans-impedance gain is selected to be 110 dB ohm. In another example, the trans-impedance gain is selected to be greater than 82 dB ohm. It is appreciated that the trans-impedance gain can be other suitable values as well.

A first stage of a multistage amplifier topology is configured to yield a first portion of the trans-impedance gain at block 906. The first stage includes, in one example, a first amplifier and a first feedback loop utilizing a first feedback resistor. The above description, including the description of FIG. 3, can be referenced for an example of a suitable configuration of the first stage.

A second stage of the multi-stage amplifier topology is configured to yield a second portion of the trans-impedance gain at block 908. The second stage, in one example, includes a second amplifier. In one variation, the second amplifier is configured with an open loop to provide an open loop voltage gain as the second portion of the trans-impedance gain. In another, the second amplifier is configured with a resistive feedback and input. In yet another, the second amplifier is configured with a capacitive feedback and input. Some example configurations are provided, including FIGS. 4, 5, and 6.

The resonator signal is amplified with the selected trans-impedance gain using the first and second stages of the multi-stage amplifier topology at block 910. The multi-stage topology enhances the trans-impedance gain. Further, the trans-impedance amplification performed by the method 900 moves the two terminals of the feedback resistor for the topology to higher frequencies than other approaches.

It will be appreciated that while reference is made throughout this document to exemplary structures in discussing aspects of methodologies described herein (e.g., the structure presented in FIGS. 1-8, while discussing the methodology set forth in FIG. 9), that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

An amplifier and oscillator system includes a MEMS resonator and a two stage amplifier topology. The MEMS resonator is configured to generate a resonator signal. The two-stage amplifier topology is configured to amplify the resonator signal with a selected trans-impedance gain. Additionally, the two stage amplifier topology yields a feedback resistance that provides the selected trans-impedance gain.

A trans-impedance voltage gain amplifier topology includes a first stage and a second stage. The first stage is configured to receive an input signal and to provide a first stage output having a first trans-impedance gain. The second stage is configured to receive the first stage input and to provide a topology output signal having a second trans-impedance gain. The first trans-impedance gain and the second trans-impedance gain yield a selected trans-impedance gain.

A method of operating an oscillator system is disclosed. A resonator signal is generated. Current to voltage amplification is performed on the resonator signal to provide a first stage output signal having a first stage trans-impedance gain. Amplification of the first stage output signal is performed to provide a second stage output signal. The amplification of the first stage output signal has is performed with a second stage trans-impedance gain. The second stage output signal is created with an overall selected trans impedance gain.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. An amplifier and oscillator system comprising:
 a MEMS resonator configured to generate a resonator signal;
 a two stage amplifier topology configured to amplify the resonator signal with a selected trans-impedance gain, the two stage amplifier topology having a feedback resistance that yields the selected trans-impedance gain, wherein the two stage amplifier topology includes:
  a first stage including a first amplifier configured to receive the resonator signal at an input of the first amplifier, to perform a current to voltage amplification of the received resonator signal, and to generate a first stage output signal at an output of the first amplifier, wherein a fixed feedback resistor is connected between the input and the output; and
  a second stage including an open-loop amplifier configured to receive the first stage output signal at an input of the open-loop amplifier, to perform a voltage to voltage amplification of the received first stage output signal, and to generate a second stage output signal at an output of the open-loop amplifier.

2. The system of claim 1, wherein the first stage is configured to provide a first stage gain and a first stage trans-impedance feedback loop.

3. The system of claim 1, wherein the first stage is configured to provide a first stage gain, wherein the second stage is configured to provide a second stage gain, and wherein the first stage gain and the second stage gain comprise the selected trans-impedance gain.

4. The system of claim 1, wherein the first amplifier and the open-loop amplifier are differential amplifiers.

5. The system of claim 1, further including:
 a buffer configured to receive the second stage output signal at an input of the buffer and to generate a buffered second stage output signal.

6. A trans-impedance voltage gain amplifier topology comprising:
 a first stage configured to receive an input signal and to provide a first stage output signal having a first trans-impedance gain at an output of the first stage; and
 a second stage configured to receive the first stage output signal and to provide a second stage output signal having a second trans-impedance gain, wherein the second stage includes a second stage amplifier, a first capacitor, and a second capacitor, wherein the first capacitor is connected between an input of the second stage amplifier and the output of the first stage, wherein the second capacitor is connected between an output of the second stage amplifier and the input of the second stage amplifier, and wherein the second trans-impedance gain is a ratio of capacitances of the first and second capacitors;
 wherein the first trans-impedance gain and the second trans-impedance gain yield a selected trans impedance gain.

7. The topology of claim 6, wherein the first trans-impedance gain is fixed.

8. The topology of claim 6, further comprising a resonator configured to generate the input signal.

9. The topology of claim 6, wherein the first stage includes a first stage differential amplifier, and wherein the second stage amplifier is a differential amplifier.

10. The topology of claim 6, wherein the first stage includes a first amplifier configured to receive the input signal at an input of the first amplifier and to generate the first stage output signal at an output of the first amplifier, wherein a fixed feedback resistor is connected between the input of the first amplifier and the output of the first amplifier.

11. The topology of claim 6, wherein the first stage includes a first amplifier configured to receive the input signal at an input of the first amplifier and to generate the first stage output signal at an output of the first amplifier, wherein a passive feedback resistor is connected between the input of the first amplifier and the output of the first amplifier.

12. The topology of claim 6, wherein the first stage amplifies current to voltage.

13. The topology of claim 6, further including:
 a buffer configured to receive the second stage output signal at an input of the buffer and to generate a buffered second stage output signal.

14. A method of operating an oscillator system, the method comprising:
 generating a resonator signal;
 performing a current to voltage amplification of the resonator signal using a fixed feedback resistor to provide a first stage output signal having a first stage trans-impedance gain; and
 performing an amplification of the first stage output signal using a fixed feedback capacitor to provide a second stage output signal having a second stage trans-impedance gain and an overall selected trans-impedance gain, wherein the fixed feedback capacitor is connected to the first stage output signal at a first terminal and to the second stage output signal at a second terminal.

15. The method of claim 14, further including:
 performing the current to voltage amplification without introducing transistor flicker noise into the first stage output signal.

16. The method of claim 14, further including:
 performing the current to voltage amplification of the resonator signal as a differential amplification; and
 performing the amplification of the first stage output signal as a differential amplification.

17. The method of claim 14, further including:
 performing the amplification of the first stage output signal using a second stage amplifier having a gain defined by a ratio of capacitances, the capacitances corresponding to first and second capacitors respectively arranged between an input and output of the second stage amplifier and between the input of the second stage amplifier and the first stage output signal.

18. The method of claim 14, further including:
 buffering the second stage output signal to generate a buffered second stage output signal.

* * * * *